US006057632A

United States Patent [19]

Ustuner

[11] Patent Number: 6,057,632

[45] Date of Patent: May 2, 2000

[54] FREQUENCY AND BANDWIDTH CONTROLLED ULTRASOUND TRANSDUCER

[75] Inventor: Kutay F. Ustuner, Mountain View, Calif.

[73] Assignee: Acuson Corporation, Mountain View, Calif.

[21] Appl. No.: 09/094,414

[22] Filed: Jun. 9, 1998

[51] Int. Cl.$^{7}$ .................................................... H01L 41/04

[52] U.S. Cl. ........................................... 310/334; 310/367

[58] Field of Search .................................... 310/334, 335, 310/367, 368; 600/459

[56] References Cited

U.S. PATENT DOCUMENTS

| | | | |
|---|---|---|---|
| 3,939,467 | 2/1976 | Cook et al. | 367/155 |
| 4,350,917 | 9/1982 | Lizzi et al. | 310/335 |
| 4,550,607 | 11/1985 | Maslak et al. | 73/626 |
| 4,686,408 | 8/1987 | Ishiyama | 310/334 |
| 5,083,568 | 1/1992 | Shimazki et al. | 310/335 |
| 5,163,436 | 11/1992 | Saitoh et al. | 310/335 |
| 5,212,671 | 5/1993 | Fujii et al. | 367/151 |
| 5,415,175 | 5/1995 | Hanafy et al. | 128/662.03 |
| 5,438,998 | 8/1995 | Hanafy | 310/334 |
| 5,546,946 | 8/1996 | Souquet | 128/662.03 |
| 5,677,491 | 10/1997 | Ishrak et al. | 73/641 |

*Primary Examiner*—Thomas M. Dougherty
*Assistant Examiner*—Peter Medley
*Attorney, Agent, or Firm*—Brinks Hofer Gilson & Lione

[57] ABSTRACT

A wideband ultrasound transducer having a plurality of transducer elements sequentially arranged in an azimuth direction. Each transducer element is spaced from adjacent transducer elements in the azimuth direction and each transducer element extends from a first end to a second end in an elevation direction. Each transducer element has a thickness in a range direction that increases from the first end to the second end wherein each transducer element is thinnest at the first end and thickest at the second end. The spacing of the transducer elements increases from the first end to the second end so that the spacing is at a minimum at the first end and a maximum at the second end. Alternatively, each transducer element has a thickness in a range direction that increases from the first end to the second end and each transducer element has a front surface defined by a concave surface having a concavity dependent on its position along the elevation direction wherein subsegments of an elevation aperture focus at shallower depths at the first end and deeper depths at the second end when the transducer is in use.

10 Claims, 5 Drawing Sheets

Fig 7
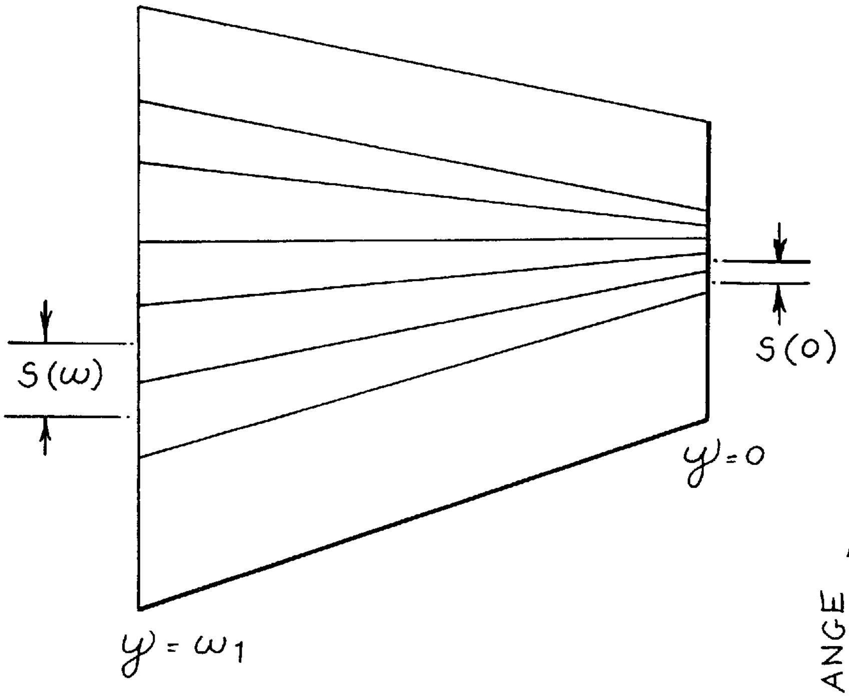
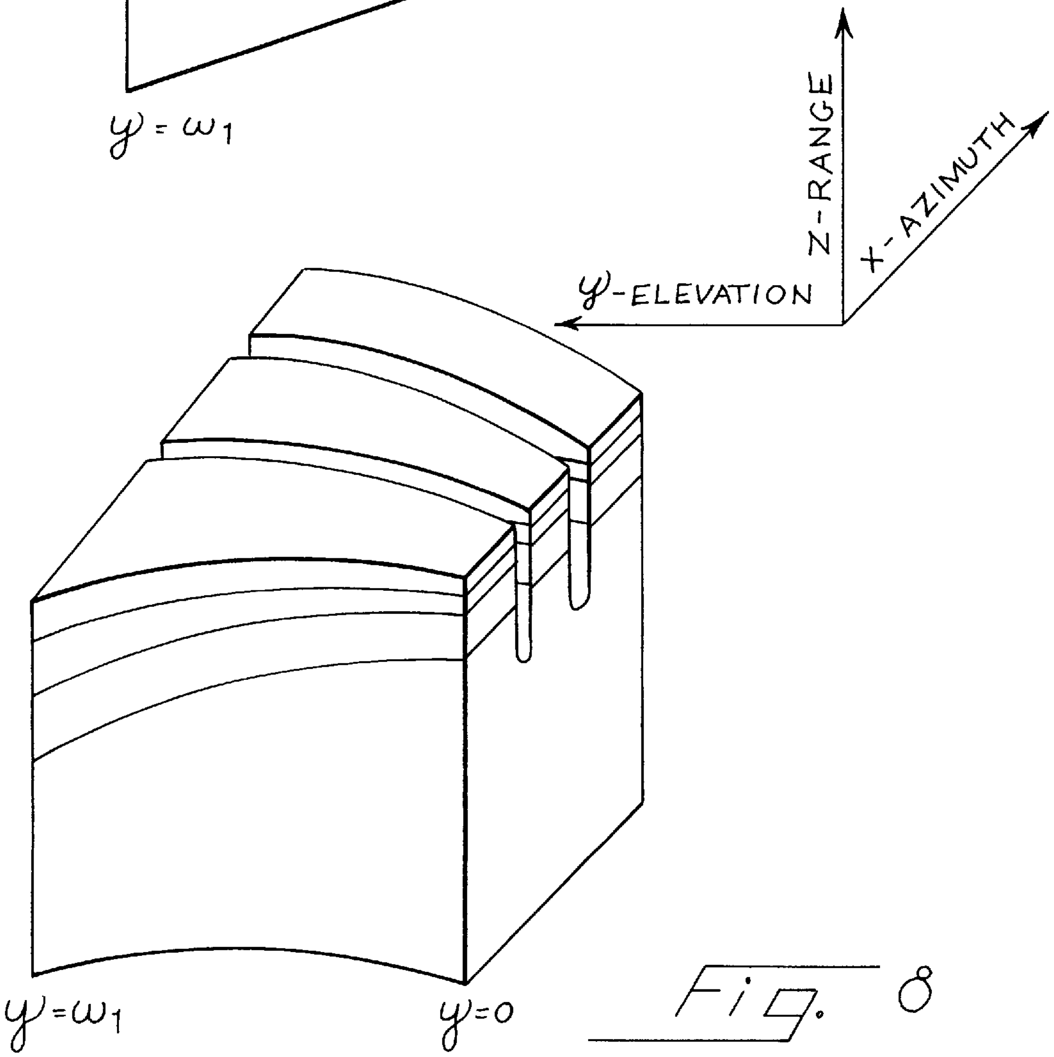
Fig. 8

FREQUENCY AND BANDWIDTH CONTROLLED ULTRASOUND TRANSDUCER

FIELD OF THE INVENTION

This invention relates to broadband transducers particularly for use in the medical ultrasound imaging field that provide frequency and bandwidth control of elevation aperture size and position as well as elevation focal depth of an emitted ultrasound beam through a combination of variations in thickness of each transducer element, variations in spacing between adjacent transducer elements and/or variations in radii of curvature of each transducer element.

BACKGROUND OF THE INVENTION

Acoustic imaging systems incorporate acoustic transducers for converting electrical signals into mechanical pressure or particle displacement signals and vice versa. The conversion is done typically by a piezoelectric ceramic, or in the case of transducer arrays by an array of ceramics. The plane defined by the axis of the array and the normal to the array's active surface is known as the azimuthal plane and the plane orthogonal to the azimuthal plane is known as the elevation plane. In the azimuthal plane, steering, focusing and aperture control are accomplished electronically by the imaging system through applying appropriate delay, phase and apodization to the individual array elements. An example of an acoustic imaging system can be found in U.S. Pat. No. 4,550,607 (Maslak et al.), for example.

For one-dimensional arrays, elevation plane focusing can generally be categorized as either lens focused or mechanically focused. In the case of lens focused arrays, the active emitting surface of the array is flat in the elevation plane and a shaped lens is placed between the object to be imaged and the active surface of the array. U.S. Pat. Nos. 4,686,408 and 5,163,436 describe lens focused phased array transducers. The material used to form the lens is typically silicone based and, unfortunately, also has the undesirable property of absorbing or attenuating passing ultrasound energy and thereby reducing the overall sensitivity of the transducer array. Mechanically focused transducer arrays involve curving the active surface of the transducer array along the elevation direction. The elevation aperture size and elevation focus depth for lens and mechanically focused transducer arrays, however, remains fixed.

For one-and-a-half dimensional arrays (1.5-D array) and two-dimensional arrays (2-D array), on the other hand, steering angle and focus depth in elevation, typically to a limited extent, and elevation aperture size are also controllable electronically by the imaging system. 1.5 and 2-D arrays require, respectively, 2 to 4 times and 16 to 64 times more number of acquisition channels compared to one dimensional arrays. Therefore a much more complex and expensive system hardware is required. They, however, offer better control over elevation beam width (slice thickness) which potentially improves detectability of targets that have a small extent in elevation. 2-D arrays also allow three-dimensional imaging.

Some of the basic design parameters considered when designing a transducer array include the center frequency, bandwidth, elevation aperture size, elevation focal depth and element spacing. Center frequency and bandwidth define the pass-band of the transducer impulse response. The frequency of operation, together with the aperture size, determine the lateral resolution of the beam both in azimuth and elevation, and the beam's penetration. Therefore, for imaging shallow structures where penetration is not an issue, the operating frequency should be high to maximize detail resolution. However, to image deep, the operating frequency has to be low in order to penetrate. The absolute bandwidth for any given operating frequency determines the axial resolution at focus. For a given operating frequency, elevation aperture size and elevation focal depth determine the focusing in elevation. For high frequency operations which are limited to imaging shallow structures, the elevation aperture should be small and focusing depth should be shallow to maximize contrast resolution in the near field. For low frequency operations, however, elevation aperture should be large and focusing depth should be deep for the best resolution and signal-to-noise ratio. Element spacing, along with the operating frequency, determines the grating lobe levels and also, given the number of transducer elements, determines the physical aperture size. Therefore, for high operating frequencies where grating lobe levels may be an issue, element spacing has to be small to minimize the grating lobe levels. But for low operating frequencies where grating lobe levels are not an issue, element spacing should be large to maximize the aperture size and thus resolution and penetration.

Barthe, P. G., "Analysis of Tapered Thickness Piezoelectric Ceramics for Ultrasound Transducers," Ph.D. Thesis, Georgia Institute of Technology, 1991, suggests tapering the thickness of a transducer ceramic to achieve very wide bandwidth transducers. But, for such broadband transducers, Barthe does not address the problem of optimizing frequency dependent transducer parameters such as elevation aperture size, elevation focal depth, and element spacing.

U.S. Pat. Nos. 5,415,175 ("the '175 patent") and 5,438,998 ("the '998 patent") describe varying the thickness of a transducer ceramic and matching layers in elevation such that the ceramic is thick at the edges and narrow at the center. With this structure, the elevation aperture becomes a function of frequency and bandwidth; tapered and small at high frequencies and untapered and wide at low frequencies, and the elevation focal depth is determined by the ceramic's thickness profile and the applied bending. This technique works well to achieve a narrow elevation aperture if the frequency is high and the bandwidth is narrow. However, for high frequency/wide bandwidth operations, it is hard to achieve elevation aperture reductions unless a very aggressive edge to center thickness ratio is used. On the other hand, for low frequency/narrow bandwidth operations, and especially if the edge/center thickness ratio is high, the elevation apodization may become inverse-cosine like. This may cause increased elevation side lobe levels for low frequency, narrow bandwidth operations.

U.S. Ser. No. 08/675,412 entitled "Ultrasound Transducer for Multiple Focusing and Method for Manufacture Thereof", filed on Jul. 2, 1996 which is hereby specifically incorporated herein by reference describes varying the thickness of the ceramic and matching layers along the elevation direction such that the elements are thinnest at one end of the array and thickest at the other. This allows for frequency and bandwidth control of the elevation aperture position and size for all operating frequencies and the effective apodization shape is always unimodal. On the other hand the transducer array described the '175 and '998 patents has a fixed aperture position and bandwidth control of the aperture size is only possible at the highest operating frequency and the apodization shape can be bimodal at low operating frequencies when the operation bandwidth is narrow. The '412 application also suggests bending the array along the elevation direction. This allows, if the elements are convex, steering the elevation beam by changing the operating frequency or, if the elements are concave, focusing at a fixed focus at all frequencies. By appropriately designing the ceramic and matching layer thickness as a function of the elevation position, the elevation aperture size can be optimized for each frequency.

It is thus desirable to provide a wide bandwidth transducer that can operate at a wide range of operating frequencies and that optimizes the elevation aperture size, elevation focus depth and element spacing for the frequency of operation. It is also desirable to provide a one-dimensional array that allows electronic control of slice thickness and limited three-dimensional imaging through controlling of frequency and bandwidth.

It is also desirable to provide a two-dimensional transducer that has the same number of transducer elements as a conventional one-dimensional array that can be used to perform three-dimensional imaging without requiring any physical translation of the transducer.

SUMMARY OF THE INVENTION

According to a first aspect of the invention there is provided a wide bandwidth ultrasound transducer comprising: a plurality of transducer elements sequentially arranged in an azimuth direction wherein each transducer element is spaced from adjacent transducer elements in the azimuth direction; each transducer element extends from a first end to a second end in an elevation direction; each transducer element having a thickness in a range direction that increases from the first end to the second end wherein each transducer element is thinnest at the first end and thickest at the second end; and the spacing of the transducer elements increases from the first end to the second end so that the spacing is at a minimum at the first end and a maximum at the second end.

According to a second aspect of the invention there is provided a wide bandwidth ultrasound transducer comprising: a plurality of transducer elements sequentially arranged in an azimuth direction; each transducer element extends from a first end to a second end in an elevation direction; each transducer element having a thickness in a range direction that increases from the first end to the second end wherein each transducer element is thinnest at the first end and thickest at the second end; and each transducer element has a front surface defined by a concave surface having a concavity dependent on its position along the elevation direction wherein subsegments of an elevation aperture focus at shallower depths at the first end and deeper depths at the second end when the transducer is in use.

The invention itself, together with further objects and attendant advantages, will best be understood by reference to the following detailed description, taken in conjunction with the accompanying drawings.

BRIEF DESCRIPTION OF THE DRAWINGS

FIG. 7 is a top view of the transducer array shown in FIG. 2.

FIG. 8 is a perspective view of a broadband transducer array according to another preferred embodiment in which the plurality of transducer elements have a front surface which is convex in shape.

DETAILED DESCRIPTION OF THE PRESENTLY PREFERRED EMBODIMENTS

Figure 1:
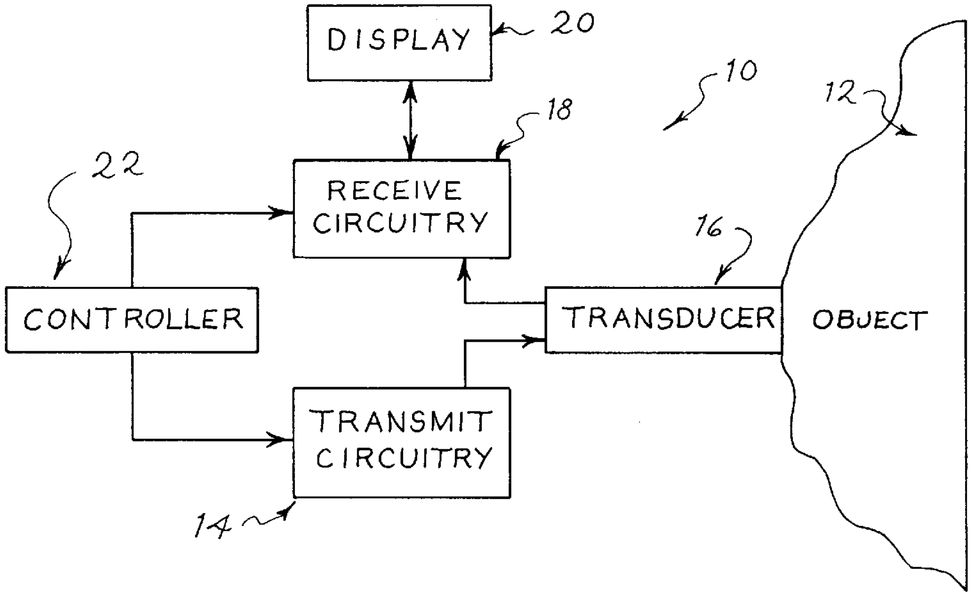
FIG. 1 is a block diagram of an ultrasound system for generating an image.

FIG. 1 is a block diagram of an ultrasound system 10 for generating an image of an object or body 12 being observed. The ultrasound system 10 has transmit circuitry 14 for transmitting electrical signals to an ultrasound transducer 16, receive circuitry 18 for processing the signals received by the transducer 16, and a display 20 for providing the image of the object 12 being observed in a region of examination. The transducer 16 converts electrical excitation signals provided by the transmit circuitry 14 to pressure waves and converts pressure waves reflected from the object 12 being examined into corresponding electrical signals which are then processed in the receive circuitry 18 and ultimately displayed. on display 20.

The transmit circuitry 14 includes a transmit beamformer controlled by a controller 22 which applies analog transmit voltage waveforms via a multichannel switch (not shown) to an array of transducer elements housed in the transducer 16. As was previously mentioned in a preferred embodiment the receive beamformer preferably includes a dynamic receive focusing system that allows the focus of the receive beamformer to be changed at a high rate in order to follow as accurately as possible the range along the ultrasonic scan line corresponding to the currently arriving signals. The transducer 16 will be described in greater detail with reference to FIGS. 2–4. FIG. 1 is meant to represent generically an ultrasound system and not to limit the present invention in any way.

Figure 2:
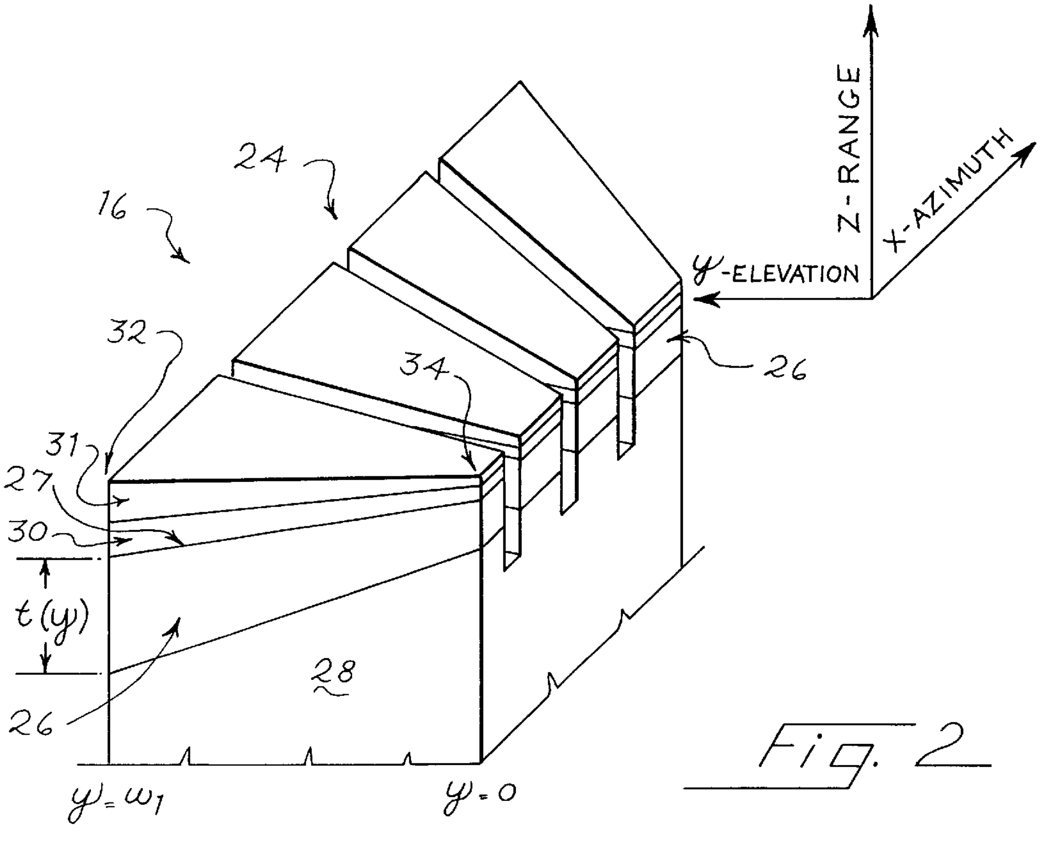
FIG. 2 is a perspective view of a broadband transducer array according to a preferred embodiment of the present invention.

FIG. 2 is a perspective view of a broadband transducer array according to a preferred embodiment of the present invention. To simplify and illustrate the relevant features of the transducer not all of the components forming the transducer have been shown.

Referring to FIG. 2, the transducer 16 contains an array 24 of transducer elements 26 sequentially arranged along the x-azimuth direction. The indicated x, y and z directions are referred to as the x-azimuth, y-elevation and z-range directions, respectively. Typically, there are one hundred twenty eight elements 26 sequentially disposed along the x-azimuthal direction forming the broadband transducer array 24. The array may, however, consist of any number of transducer elements each arranged in any desired geometrical configuration.

The transducer elements 26 are disposed on a support or backing block 28. The backing block 28 is preferably made of a highly attenuative material such that ultrasound energy radiated in its direction (i.e., away from an object in a region of examination) is substantially absorbed. In a preferred embodiment two acoustic matching layers 30 and 31 may be disposed on an active surface 27 of each transducer element 26. The active surface 27 of each transducer element refers to that surface that will face a region of examination when the transducer is in use and is opposite of a bottom surface that faces the backing block 28. As is well known, each transducer element 26 has an electrode (not shown) formed on its top, active surface and its bottom surface. A flex circuit (not shown) is preferably disposed between each transducer element 26 and the backing block 28. As is well known, the flex circuit (not shown) has a center pad area that is disposed directly beneath the bottom electrode of each transducer element. Traces (not shown) extend from both sides of the center pad area, and, when the transducer is in use, the traces are coupled to the transmit and receive circuits shown in FIG. 1. The flex circuit preferably delivers an excitation signal from the transmit circuitry to the transducer elements 26 either all at one time or sequentially as is well known to those of ordinary skill in the art. Also, a ground flex circuit (not shown) is preferably disposed on the top electrode of each transducer element between the transducer element 26 and the acoustic matching layer 30. The flex circuits may be, for example, any interconnecting design used in the acoustic or integrated circuit fields. The flexible circuits are typically made of a copper layer carrying a lead for exciting the transducer element. The copper layer may be bonded to a piece of polyimide material, typically KAPTON™. Preferably the center pad area of the copper layer is coextensive in size with the electrodes formed on each transducer element. In addition, the interconnect circuit may be gold plated to improve its contact performance. Such a flexible circuit is manufactured by Sheldahl of Northfield, Minn.

Preferably two acoustic matching layers 30 and 31 are disposed on each transducer element 26. The matching layer 30 disposed closest to the transducer element 26 is preferably a high impedance matching layer and the matching layer 31 disposed farthest from the transducer element 26 is a low impedance matching layer. In a preferred embodiment the low impedance matching layer is made of Dow Corning's DER 332 and DEH 24 having a longitudinal velocity of 2630 m/s and a density of 1200 kg/$m^3$ and the high impedance matching layer is made of Dow Corning's DER 332 and DEH 24 plus 9 micron alumina particles forming a material having a longitudinal velocity of 2064 m/s and a density of 4450 kg/$m^3$. The transducer element 26 is preferably made of a piezoelectric material and more preferably of HD 3203 available from Motorola of Albuquerque, N.Mex.

A mechanical lens (not shown) may be placed on the matching layer 31 to help confine the generated beam in the elevation-range plane and focus the ultrasound energy to a clinically useful depth in the body. Preferably a low loss polyurethane non-focusing window forms the lens. Alternatively a focusing RTV silicone lens can be used to create a compound focusing system that is partly focused by the shape of the transducer element and partly focused by the RTV lens. The transducer array 24 may be housed in a nose piece (not shown). Examples of prior art transducer structures are disclosed in Charles S. DeSilets, *Transducer Arrays Suitable for Acoustic Imaging*, Ph.D. Thesis, Stanford University (1978) and Alan R. Selfridge, *Design and Fabrication of Ultrasonic Transducers and Transducer Arrays*, Ph.D. Thesis, Stanford University (1982).

Each transducer element 26 has a thickness extending in the z-range direction from a first end 32 at $y=w_1$ to a second end 34 at y=o. The thickness of each transducer element 26 is dependent on its position along the y-elevation direction and will be defined as t(y). In a preferred embodiment, the thickness t(y) of each transducer element 26 is at a maximum at y=w, and a minimum at y=o. In a preferred embodiment the thickness of each transducer element 26 continuously increases from its minimum thickness at y=o to its maximum thickness at $y=w_1$. The first and second acoustic matching layers 30 and 31 also have a thickness that continuously increases from a minimum thickness at y=o to a maximum thickness at $y=w_1$.

Figure 3:
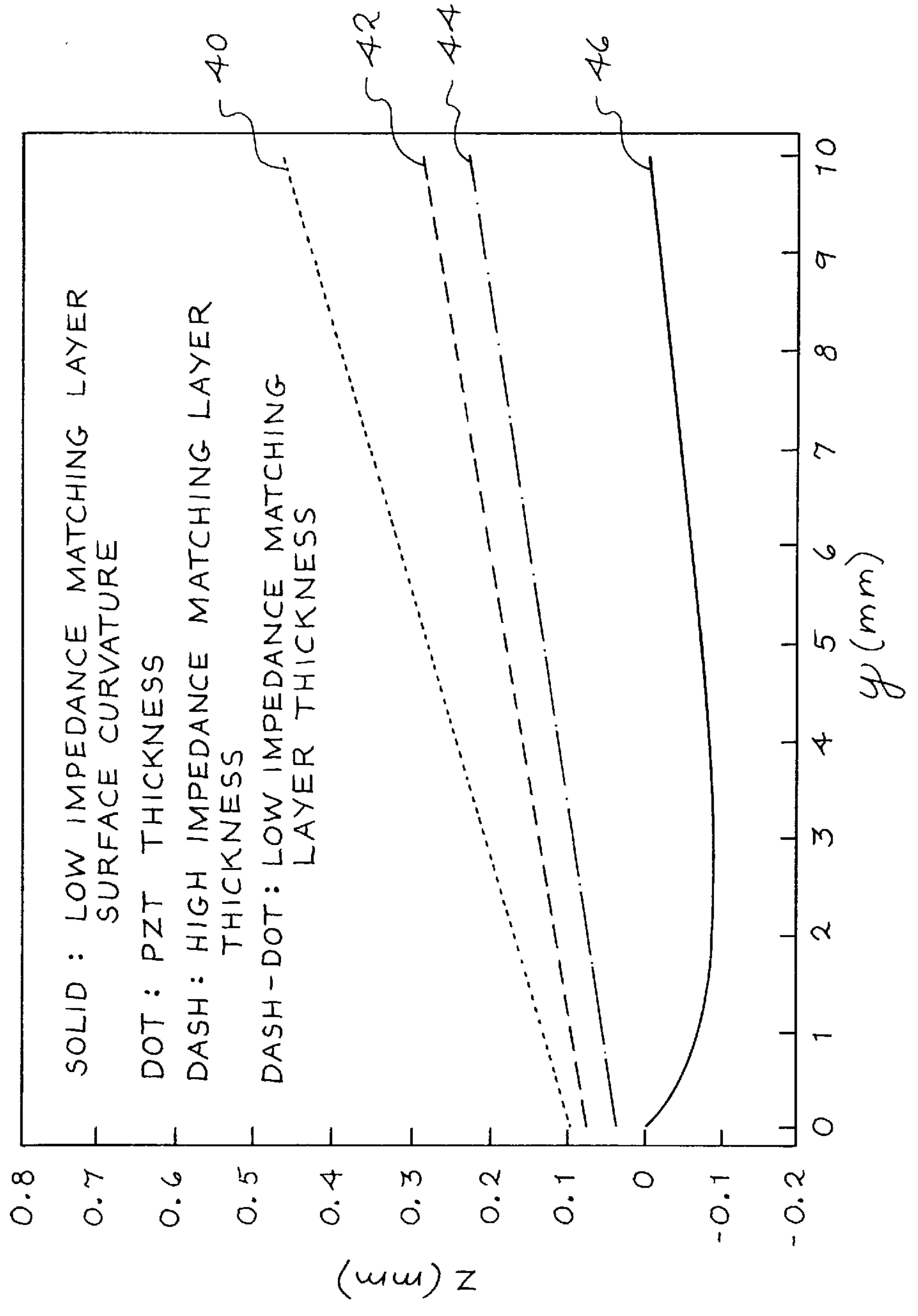
FIG. 3 is a graph of the thickness profiles of the transducer element and matching layers as well as the curvature of a front acoustic matching layer.

FIG. 3 is a graph of the thickness profile of the transducer element 26 and matching layers 30 and 31. The y- elevation axis is plotted along the horizontal axis in millimeters and the z-range axis is plotted along the vertical axis in millimeters. Line 40 represents the thickness of each transducer element 26 for each point along its elevation width measured with respect to z=0 mm. Each transducer element has an elevation width preferably of 10 mm. Line 42 represents the thickness of each high impedance matching layer 30 for each point along its elevation width measured with respect to z=0 mm. Line 44 represents the thickness of each low impedance matching layer 31 for each point along its elevation width measured with respect to z=0 mm.

In a preferred embodiment the ceramic thickness of each transducer element 26 at y=o is about 0.94 mm and at $y=w_1$ is about 0.4635 mm. The width $w_1$ is about 10 mm. The first, high impedance acoustic matching layer 30 has a minimum thickness at y=o of about 0.737 mm and a maximum thickness at $y=w_1$ of about 0.2857 mm. The second, low impedance acoustic matching layer 31 has a minimum thickness at y=o of about 0.0356 mm and a maximum thickness at $y=w_1$ of about 0.2286 mm. Line 46 illustrates the curvature of a top surface of acoustic matching layer 31 which will be described hereinafter.

Figure 4:
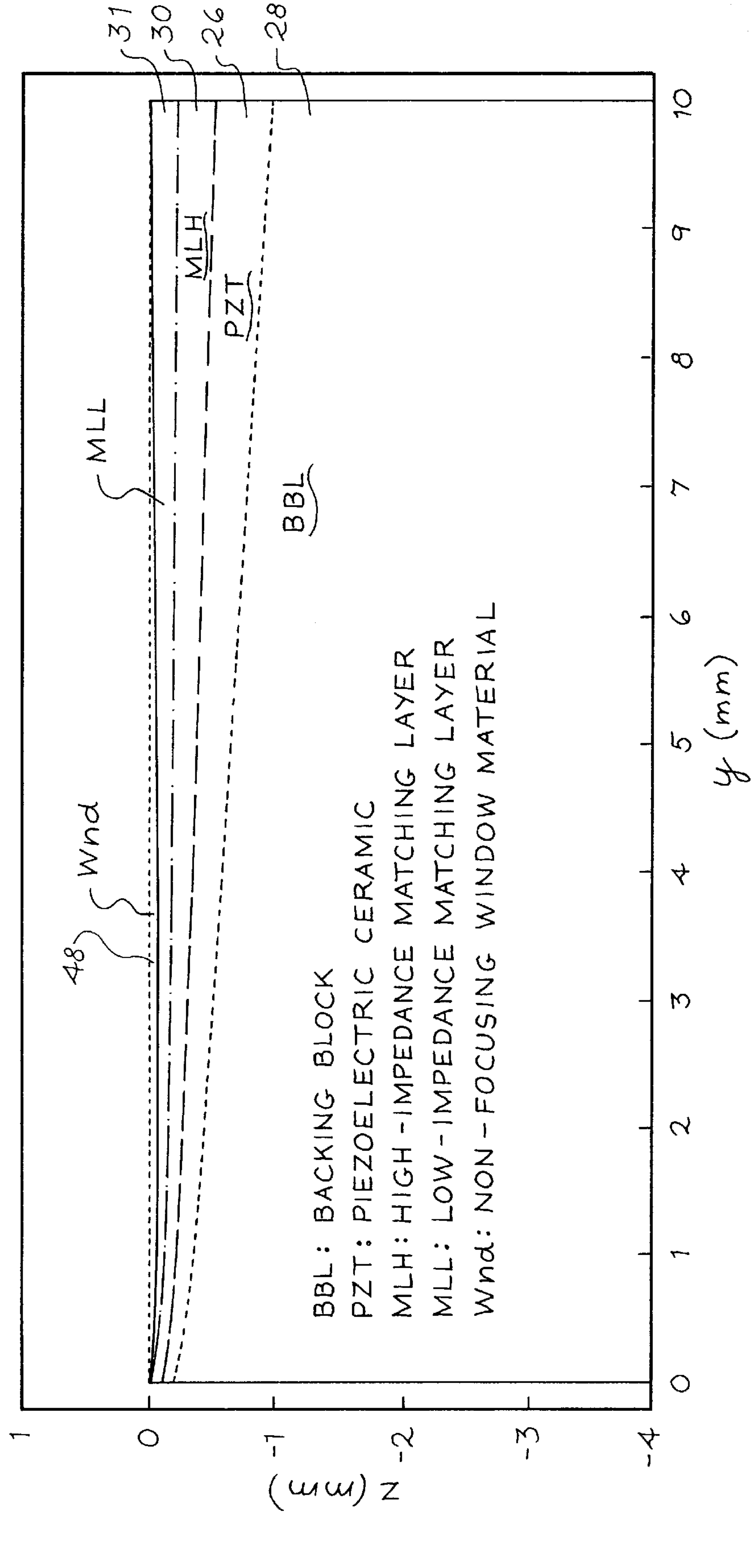
FIG. 4 is a graph of an assemble transducer element on a backing block.

FIG. 4 is a graph of an assembled transducer element on a backing block. The y-elevation axis is plotted along the horizontal axis in millimeters and the z-range axis is plotted along the vertical axis in millimeters. It can be seen from FIG. 4 that the surface of the backing block 28 on which the transducer element 26 is disposed is sloped. Optionally a nonfocussing window 48 may be disposed on matching layer 31. The nonfocussing window 48 fills in the curved top surface of the matching layer which will now be described.

Figure 5:
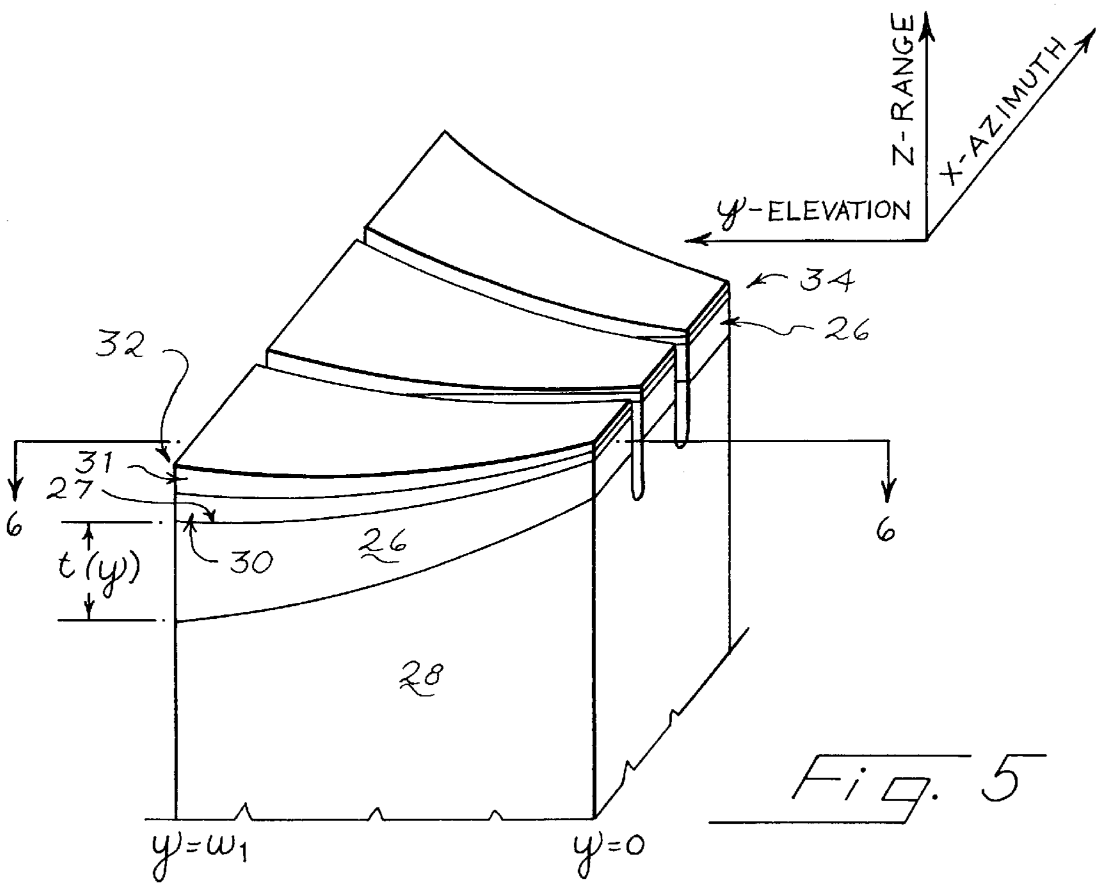
FIG. 5 is a perspective view of a broadband transducer array according to another preferred embodiment of the present invention.

FIG. 5 is a perspective view of a broadband transducer array according to another preferred embodiment of the present invention. The same reference numerals as used in FIG. 2 will be used in FIG. 5 to identify like components even though the components in FIG. 5 are of a different shape than those of FIG. 2. In FIG. 5 the top surface of the backing block 28 is curved and the transducer element 26 and matching layers 30, 31 are also curved. Otherwise the dimensions of the thicknesses of the transducer element 26 and matching layers 30, 31 are the same as previously described with respect to the array shown in FIG. 2.

Figure 6:
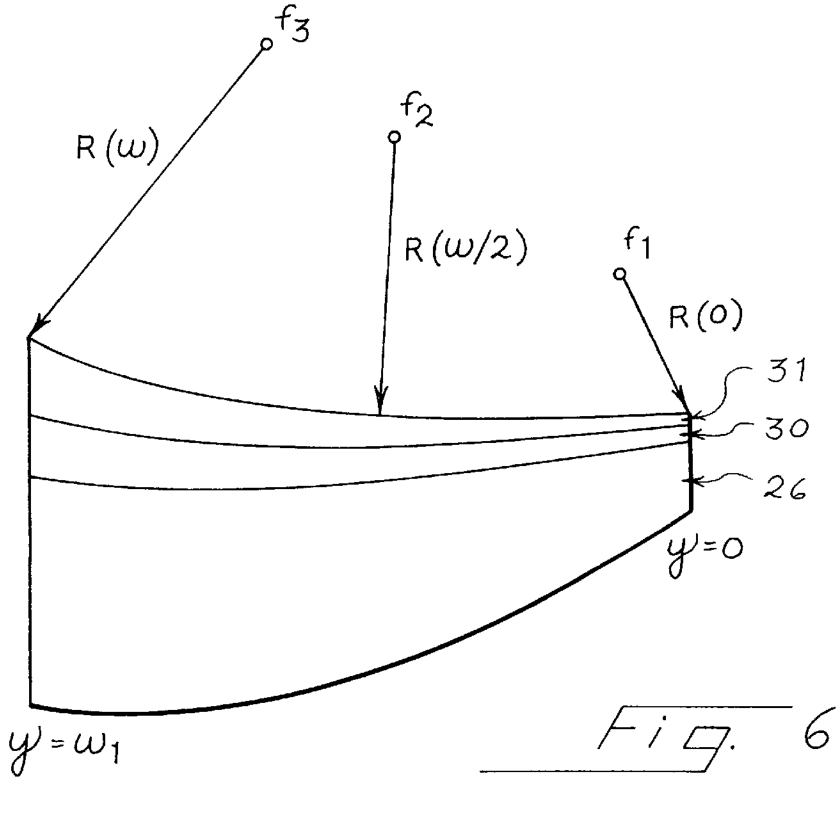
FIG. 6 is a cross-sectional view of the transducer array shown in FIG. 5 taken along lines 6—6.

FIG. 6 is a cross-sectional view of the transducer array shown in FIG. 5 taken along line 6—6. In this preferred embodiment each transducer element 26 is curved, as shown, and more preferably, the radius of curvature r(y) and its origin varies as a function of its position along the y-elevation direction so that the focal depth of the ultrasound beam will vary depending on which portion of the transducer element 26 is excited. For example, if a high frequency excitation signal is used to excite the transducer element 26, then the thinner portion of the transducer element will be active producing a beam focused at focal point $f_1$. An excitation signal having a lower frequency will excite the thicker portions of the transducer element so that the beam will be focused at other points such as focal point $f_2$ or $f_3$, It can thus be seen that the elevation focal depth of the emitted ultrasound beam is controlled by the excitation signal applied to the transducer element.

Assuming the thickness of the transducer element 26 increases linearly as a function of y, the radius of curvature R(y) that is also a linear function of y and is given by the following equation:

$$R(y)=R(0)+(R(W_1)-R(0))/W_1$$

where W is the elevation aperture width and R(0) and $R(W_1)$ are the elevation focus depths for y=0 and $W_1$, respectively. The low-impedance matching layer 31 has a surface profile z(y) as a function of R(y) is given by $$z(y)=d(y)-(d(W)-d(0))\times(y/W),$$

where the distance function d(y) is given by $$d(y)=(R^2(y)-y^2)^{1/2}-R(y),$$

Note that z(y) is d(y) minus the linear component of d(y).

FIG. 7 is a top view of the transducer array shown in FIG. 2. The transducer array has a periodic spacing s(w) that is defined by the distance between the midpoints of adjacent transducer elements. The periodic spacing s(y) is dependent upon its position along the y-elevation direction. In a preferred embodiment the spacing s(y) decreases from a maximum at y=w to a minimum at y=o. A uniform width kerf is formed between adjacent transducers.

It will be realized of course that FIGS. 2–7 are not drawn to scale but are merely intended for illustration purposes.

It was previously found that varying the ceramic thickness provided a very wide bandwidth transducer. But, for such wide bandwidth transducers, problems of optimizing the frequency dependent transducer parameters such as element spacing, elevation focal depth, were not solved. By providing an asymmetric ceramic thickness function t(y), position element spacing s(y) and a radius of curvature R(y) as a function of elevation, the frequency dependent transducer parameters can be optimized.

Through the elevation position dependence of the ceramic and matching layer's thickness, the radius of curvature and the element spacing, it is possible to continuously slide the elevation aperture position and steer the elevation beam by changing the operating frequency. Also, for each operating frequency, the elevation aperture size, elevation focal depth and element spacing (therefore, the element width and azimuthal aperture size) can be tailored to achieve optimum performance at all frequencies. Elevation aperture size is further controlled by the bandwidth of the excitation signal. Bandwidth control of elevation aperture size is not unique to high frequency excitation signals as in the transducer designs according to the '175 and '998 patents, but it is true for all operating frequencies.

In conjunction with varying the ceramic thickness t(y) and the matching layer thickness (ml(y)) as either decreasing or increasing functions of elevation position y as described U.S. Ser. No. 08/675,412 described above, by also providing elevation position dependent radius of curvature (R(y)) such that R increases as y increases, and/or elevation position dependent element spacing s(y) such that s increases as y increases. One can optimize the elevation focal depth and element spacing and therefore, the element width and the aperture size in azimuth over the entire frequency spectrum.

Thus, the present invention provides very wide bandwidth transducers optimized over the full spectrum of frequencies in terms of elevation focus depth and element spacing potentially replacing two or three conventional transducers and 2-D transducers with the same number of elements as conventional 1-D transducers, suitable for (possibly real-time) 3-D imaging without any physical translation of the transducer.

In addition, the ultrasound beam can be steered in two directions, the x-azimuth direction by appropriately timing the excitation signals to each transducer element and in the y-elevation direction by controlling the frequency and bandwidth of the applied excitation signal, the transducer according to the present invention can be used to perform limited three-dimensional imaging or spatial compounding in elevation without requiring physical translation of the transducer and without requiring more transducer element than are required for conventional one-dimensional imaging.

Furthermore, because the transducer array constructed in accordance with the present invention is capable of operating at a broad range of frequencies, the transducer is capable of receiving signals possessing center frequencies other than the transmitted center frequency.

It is to be understood that the forms of the invention described herein are to be taken as preferred examples and that various changes in the shape, size and arrangement of parts may be resorted to without department from the spirit of the invention or scope of the claims.

What is claimed is:

1. A wide bandwidth ultrasound transducer comprising:

a plurality of transducer elements sequentially arranged in an azimuth direction wherein each transducer element is spaced from adjacent transducer elements in the azimuth direction;

each transducer element extends from a first end to a second end in an elevation direction;

each transducer element having a thickness in a range direction that increases from the first end to the second end wherein each transducer element is thinnest at the first end and thickest at the second end; and the spacing of the transducer elements increases from the first end to the second end so that the spacing is at a minimum at the first end and a maximum at the second end.

2. An ultrasound transducer according to claim 1 wherein each of the plurality of transducer elements have a front surface which faces a region of examination when the transducer is in use which is concave in shape.

3. An ultrasound transducer according to claim 1 wherein each of the plurality of transducer elements have a front surface which faces a region of examination when the transducer is in use which is convex in shape.

4. A wideband ultrasound transducer according to claim 1 wherein each transducer element has a front surface defined by a concave surface having a concavity dependent on its position along the elevation direction wherein subsegments of an elevation aperture focus at shallower depths at the first end and deeper depths at the second end when the transducer is in use.

5. A wideband ultrasound transducer according to claim 1 further comprising an acoustic matching layer disposed on each transducer element.

6. A wideband ultrasound transducer according to claim 5 wherein the acoustic matching layer extends from the first end of each transducer element to the second end of each transducer element and the acoustic matching layer has a thickness in the range direction that increases from the first end to the second end wherein each acoustic matching layer is thinnest at the first end and thickest at the second end.

7. A wide bandwidth ultrasound transducer comprising:

a plurality of transducer elements sequentially arranged in an azimuth direction;

each transducer element extends from a first end to a second end in an elevation direction;

each transducer element having a thickness in a range direction that increases from the first end to the second end wherein each transducer element is thinnest at the first end and thickest at the second end; and each transducer element has a front surface defined by a concave surface having a concavity dependent on its position along the elevation direction wherein subsegments of an elevation aperture focus at shallower depths at the first end and deeper depths at the second end when the transducer is in use.

8. An ultrasound transducer according to claim 7 wherein each transducer element is spaced from adjacent transducer elements in an azimuth direction and the spacing of the transducer elements increases from the first end to the second end so that the spacing is at a minimum at the first end and a maximum at the second end.

9. A wideband ultrasound transducer according to claim 8 further comprising an acoustic matching layer disposed on each transducer element.

10. A wideband ultrasound transducer according to claim 9 wherein the acoustic matching layer extends from the first end of each transducer element to the second end of each transducer element and the acoustic matching layer has a thickness in the range direction that increases from the first end to the second end wherein each acoustic matching layer is thinnest at the first end and thickest at the second end.

* * * * *

UNITED STATES PATENT AND TRADEMARK OFFICE

CERTIFICATE OF CORRECTION

PATENT NO. : 6,057,632
DATED : May 2, 2000
INVENTOR(S) : Kutay F. Ustuner

It is certified that error appears in the above-identified patent and that said Letters Patent is hereby corrected as shown below:

Column 2,
Line 61, insert -- in -- after "described".

Column 4,
Line 26, change "displayed. on" to -- displayed on --.

Column 5,
Line 65, change "y = w," to -- $y = w_1$, --.

Column 6,
Line 61, change "$f_{3,}$" to -- $f_{3.}$ --.

Column 7,
Line 46, insert -- in -- after "described".

Signed and Sealed this

Fourth Day of December, 2001

*Attest:*

*Nicholas P. Godici*

NICHOLAS P. GODICI

*Attesting Officer*

*Acting Director of the United States Patent and Trademark Office*